Oct. 29, 1957 W. D. GABOR 2,811,642

STABILIZED OSCILLATOR CIRCUIT

Filed May 14, 1954

INVENTOR
WILLIAM D. GABOR
BY
Curtis Morris & Safford
ATTORNEYS

United States Patent Office 2,811,642
Patented Oct. 29, 1957

2,811,642

STABILIZED OSCILLATOR CIRCUIT

William D. Gabor, Norwalk, Conn., assignor to C. G. S. Laboratories, Inc., Stamford, Conn.

Application May 14, 1954, Serial No. 429,745

6 Claims. (Cl. 250—36)

This invention relates to the stabilization of oscillators utilizing electrically-controlled frequency-determining elements.

Controllable inductors, based on the principle of the saturable reactor but which are capable of operation at higher frequencies, are particularly useful in controlling the frequency of tuned circuits because they permit the circuit to be tuned over a wide range of frequencies without mechanically movable parts. Such controllable inductors usually include at least two windings on a magnetizable core at least part of which is formed of ferrite material. One of these windings, called the control winding, regulates the extent of saturation of the magnetic core and thereby controls the inductance of the other winding, called the signal winding.

By using this signal winding as the inductive portion of a tuned circuit, the resonant frequency of this circuit can be changed by changing the current through the control winding.

However, because of hysteresis and temperature effects, such controllable inductors will not provide the stability necessary for many applications. The present invention provides methods and apparatus for the stabilizing of oscillator circuits in which the frequency of the generated signal is controlled by a controllable inductor.

To accomplish this a closed-loop control circuit is provided which measures the actual operating frequency of the oscillator and maintains it at any predetermined frequency. This control circuit is arranged to eliminate errors caused by variations in the amplitude of the signal delivered by the oscillator. Additional stability is provided in a preferred embodiment of the invention by an arrangement which permits the control signal to approach zero as the oscillator approaches its predetermined operating frequency.

The various objects and advantages of the invention will be explained further in connection with the following description of the series of steps of carrying out the method of the invention and in the description of various embodiments of apparatus suitable for carrying out those steps. In the accompanying drawings.

Figures 1, 2, 3:
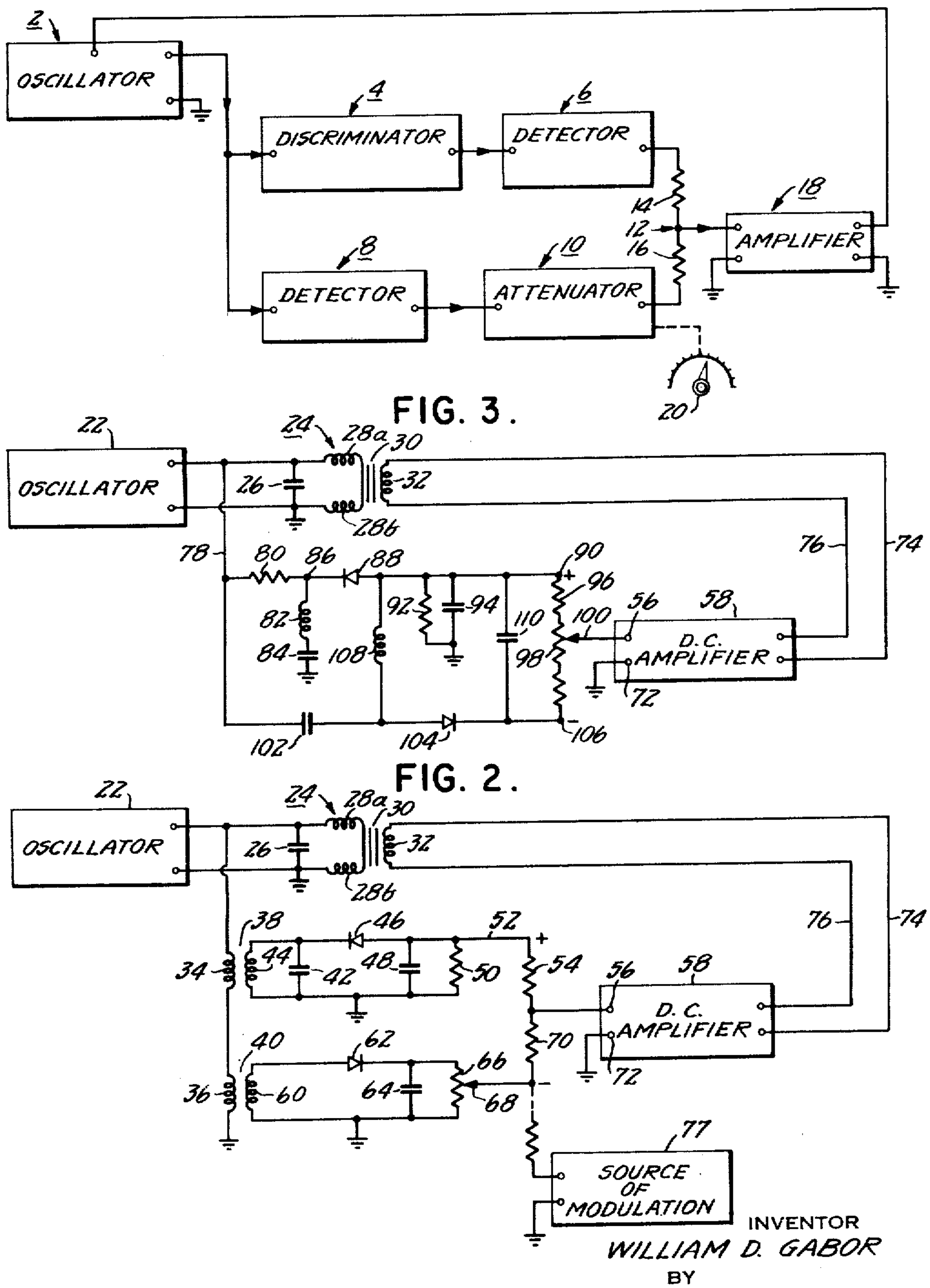
Figure 1 is a block diagram for illustrating the successive steps in a method embodying the invention.
Figure 2 is a circuit diagram of a variable frequency oscillator embodying the invention.
Figure 3 is a circuit diagram of another frequency-controlling system embodying the invention.

In Figure 1, an oscillator shown in block form at 2 is arranged to deliver an alternating signal the frequency of which can be varied by means of an electrically-operated frequency-determining element, such as a controllable inductor or an electrically-controllable capacitor. For example, capacitors using mixtures of barium and strontium titanates have a capacitance value that can be varied by changing the voltage stress on the dielectric material. Such capacitors are well known and at their present stage of development are useful for certain limited applications.

However, for most applications at this time the controllable inductor is a much more useful device.

In order to overcome the instability of the frequency-determining device, eliminate the effects of hysteresis, and compensate for changes in other circuit components of the oscillator and for changes in supply voltage, etc., a control signal is developed which is a function of the frequency of the signal being delivered by the oscillator 2. This is most readily accomplished by means of a simple discriminator indicated in block form at 4. Many forms of discriminators are known and most can be adapted to carry out the present method. It will be apparent that the discriminator must be capable of operating over the entire frequency range of the oscillator 2.

After the signal from the oscillator 2 has been passed through the discriminator the resulting signal is rectified, as indicated at 6, to produce a uni-directional measuring signal whose amplitude is a function of the frequency of the signals produced by the oscillator 2. The amplitude of this measuring signal, however, depends also upon the amplitude of the signal delivered by the oscillator. That is, the amplitude of the measuring signal increases and decreases with corresponding changes in the amplitude of the oscillator signal. To eliminate the effect of changes in the amplitude of the oscillator signal, a compensating signal is produced whose amplitude depends upon the amplitude of the signal produced by the oscillator 2 but which is unaffected by changes in the frequency of the signals. To accomplish this the signals from the oscillator are rectified, as indicated at 8, and passed through an attenuator circuit, indicated at 10, which is arranged for manual or other control. The compensating signal after attenuation is combined, in opposition, with the measuring signal, as indicated at point 12. In practice, the means used for the rectification are arranged to deliver signals of opposite polarity so that the compensating and measuring signals will be in opposition at point 12. Suitable isolation means can be provided, as indicated at 14 and 16, between the two branches of the loop.

In operation, when the attenuation in the compensating branch of the loop is used to the attenuation caused by the discrimination in the measuring branch of the loop, the point 12 will be at zero voltage irrespective of the amplitude of the signals from the oscillator.

The control signal, which is produced by the combining of the measuring and compensating signals, changes the frequency of the oscillator 2 in such direction as to maintain the point 12 at zero or nearly zero potential. To accomplish this the control signal is amplified, as indicated at 18, and applied to the frequency-determining element of the oscillator.

To change the frequency of the oscillator, the attenuation in the compensating loop is changed, for example by a manual control 20, so that a control voltage is produced at point 12. This control signal changes the frequency of the oscillator so that the attenuation caused by the frequency discrimination is again equal to the attenuation of the compensating loop and the point 12 again approaches zero value.

It will be apparent that the stability of the circuit is governed primarily by the stability of the components in the discriminator circuit. However, this circuit need include only elements of fixed value and a high degree of stability is attained readily with conventional components. It will be clear that the linearity of the discriminator is a matter of no great importance in most applications as the stability of the system does not depend upon the discriminator circuit being linear. The precision of the system depends to some extent upon the amplification of the control signal. The higher the gain around the circuit, the more nearly the point 12 will approach zero value. In this example the voltages referred to have been with respect to a common ground circuit.

The controllable inductor for controlling the oscillator frequency can be of any desired form. Suitable inductors are described in the following U. S. patent applications: Serial No. 213,548, filed March 2, 1951; Serial No. 300,196, filed July 22, 1952, and issued as Patent No. 2,799,822, dated July 16, 1957; Serial No. 300,746, filed July 24, 1952, and issued as Patent No. 2,802,185, dated August 6, 1957; all by Gerhard H. Dewitz.

In the arrangement shown in Figure 2, a variable frequency oscillator, indicated in block form at 22, is arranged so that its frequency of operation is controlled by a parallel resonant circuit 24. This resonant circuit includes a capacitor 26 connected in parallel with a signal winding 28, indicated in two parts 28*a* and 28*b*, of a controllable inductor 30. The signal winding 28 is formed in the two sections 28*a* and 28*b* to eliminate magnetic coupling with the control winding 32 as set forth more fully in the above-identified patent applications.

The signal produced by the oscillator 22 is connected through two primary windings 34 and 36 of two transformers 38 and 40, respectively, to the common ground circuit. The transformer 38 couples the signal to the measuring loop, the discriminator of which is formed by a capacitor 42 connected in parallel with the secondary winding 44 of the transformer 38. The winding 44 and the capacitor 42 form a parallel circuit resonant at a frequency slightly higher than the highest frequency at which the oscillator 22 is to be operated. Accordingly, at the highest frequency of operation, the maximum voltage will appear across this resonant circuit and as the frequency decreases this voltage will also decrease. The alternating voltage appearing across the capacitor 42 is rectified by a half-wave rectifier 46, which may be a vacuum-type diode or a suitable rectifier formed of germanium or other semi-conductor material. The signal from the rectifier 46 is filtered by a capacitor 48 so that a D.-C. signal is developed across a load resistor 50 between the common ground circuit and an output lead 52. This measuring signal is coupled through an isolating resistor 54 to an input terminal 56 of a D.-C. amplifier indicated in block form at 58.

The compensating signal is produced by the transformer 40, the secondary winding 60 of which is connected through a rectifier 62, which may be identical with the rectifier 46, and the resulting signal is filtered by means of a capacitor 64, so that a D.-C. compensating signal is developed across a potentiometer 66 which is connected in parallel with the capacitor 64, one end of the potentiometer being connected to the common ground circuit. A movable slider 68 on the potentiometer is connected through an isolating resistor 70 to the input terminal 56 of the D.-C. amplifier 58. The other input terminal 72 of the amplifier 58 is connected to the common ground circuit.

This compensating circuit is untuned so that the voltage developed across the potentiometer 66 depends only upon the amplitude of the signal applied to the primary winding 36 of the transformer 40, but over the frequency range of the oscillator 22 is independent of the applied frequency. The signal developed, however, across the load resistor 50 is a function of both the frequency and of the oscillator signal.

The two rectifiers 46 and 62 are connected with the respective circuits in reverse manner, so that the voltages developed by these two circuits are in opposition at the input terminal 56 of the D.-C. amplifier 58.

The difference voltage developed at the input terminal of the D.-C. amplifier, after amplification, is applied by means of leads 74 and 76 to the control winding 32 of the controllable inductor 30. The frequency of operation of the system is controlled by the potentiometer 66.

In operation, the difference signal at the terminal 56 is such as to increase or decrease the saturation of the controllable inductor 30 so as to drive the voltage of terminal 56 to zero with respect to the common ground circuit. For example, assume that the contact 68 of the potentiometer 66 is moved upwardly, as viewed in Figure 2, this will apply an increased voltage to the input terminal 56 in such direction as to increase the current through the control winding 32, thus causing a further increase in the degree of saturation of the core of the saturable reactor 32, and decreasing the effective inductance of the windings 28*a* and 28*b*. This decrease in inductance increases the resonant frequency of the circuit 24 and causes the oscillator 22 to deliver a signal of higher frequency. This higher frequency signal causes the discriminator network formed by the winding 44 and the capacitor 42 to deliver a measuring signal of increased amplitude, but which is of opposite polarity from the signal delivered by the compensating loop of sufficient magnitude to substantially cancel the voltage increase produced by moving the potentiometer upwardly. Accordingly, the system stabilizes at a new frequency of operation.

Movement of the slider 68 in the opposite direction, decreases the frequency of operation.

Because the output terminal 56 is operated, under balance conditions, substantially at zero voltage, the system is independent of changes in amplitude of the signal from the oscillator 22. For example, assume the amplitude of the signal developed by the oscillator 22 to increase either because of a change in supply voltage or because of a change in the frequency and more efficient operation, then the voltage developed across the load resistor 50 will increase, and the voltage will simultaneously increase across the potentiometer 66 by the same proportion: these two voltages being in opposition will cancel at the input terminal 56 of the D. C. amplifier 58.

Thus, it will be seen that a highly stable variable-frequency oscillator circuit has been provided which is capable of being tuned, without mechanically moving parts, over a wide frequency range. It is to be noted also that no complicated or expensive limiting circuits are required, but that stable and effective operation has been attained with minimum complexity.

If desired, the frequency of operation can be controlled by an external source of modulation, indicated in block form at 77, which couples either an alternating or direct voltage to the compensation loop, for example to the lower end of the resistor 70.

In Figure 3 certain of the parts corresponding to the parts described in connection with Figure 2 have been given corresponding reference characters. As in the above system, the oscillator 22 is controlled by a resonant circuit 24 which includes the capacitor 26 connected in parallel with the signal winding 28*a*—28*b* of the controllabel inductor 30. In this example the signal from the oscillator 22 is coupled through a lead 78 and an isolating resistor 80 directly to a discriminator network comprising an inductor 82 connected in series with a fixed capacitor 84 between the opposite end of the resistor 80 and the common ground circuit. In this example the inductor 82 and the capacitor 84 are arranged to be series resonant at a frequency slightly lower than the lowest frequency of operation of the oscillator 22 so that a voltage is developed at terminal 86 which is a function of the frequency of the oscillator 22. The voltage which appears at the terminal 86 is rectified by a half-wave rectifier 88, which is connected to an output terminal 90. A load resistor 92 and a filter capacitor 94 are connected in parallel between the output terminal 90 and the common ground circuit. The output terminal 90 is connected also through a fixed resistor 96 to the upper end of a potentiometer 98, which has a sliding contact 100 connected to the input terminal 56 of the D. C. amplifier 58.

The compensating signal from the lead 78 is coupled through a capacitor 102 to a half-wave rectifier 104, the output of which is connected to a terminal 106. A choke 108 is connected between the junction of the capacitor 102 and the rectifier 104 and the output terminal 90 in the measuring loop. The inductive choke 108 provides isolation at the frequency of operation but maintains these two portions of the circuit at the same D. C. level. A filter capacitor 110 is connected between the terminal 106 and the output terminal 90. The output terminal 106 is connected through an isolating resistor 112 to the lower end of the potentiometer 98. With this arrangement the two voltages, that is the measuring voltage and the compensating voltage, are added in opposition.

As described previously, the output terminals of the D. C. amplifier are connected to the control winding 32 of the controllable inductor 30 so as to vary the current to the control winding 32 in accordance with the potential applied to the input terminals 56 and 72 of the amplifier. The terminal 90 at which the measuring signal appears is positive with respect to the common ground circuit. The terminal 106, where the compensating voltage appears, is negative with respect to the common ground circuit. Accordingly, at any frequency of operation, some point along the potentiometer 98 is at zero potential with respect to the common ground circuit, and this point of zero potential will move upwardly or downwardly along the potentiometer as a function of the frequency of operation. With the sliding contact 100 positioned at a particular point, the current through the controllable winding 32 will be such as to cause the slider 100 to approach ground potential. This circuit, accordingly, is highly stable and the frequency of operation of the oscillator is substantially unaffected by changes in the amplitude of oscillation and is independent of the effects of temperature and hysteresis on the controllable inductor 30.

It is of course not essential that the two signals, that is, the compensating signal and the measuring signal, be combined in opposition before the amplification. These signals may be combined after the D. C. amplifier 58 by any suitable network, or they may be applied to separate control windings on the controllable inductor 30. For example, the controllable inductor 30 may be provided with two control windings wound in opposition on the core, one of these windings carrying the compensating signal and the other winding carrying the measuring signal. These signals are, however, in any of these arrangements effectively combined in opposition. It is also possible in some applications to place the D. C. amplifier ahead of the measuring and compensating loops. That is, the signal from the oscillator may be amplified, if its amplitude is so low as to require amplification, and the measuring and compensating signals produced by the two rectifiers coupled directly to the controllable inductor without further amplification.

From the foregoing, it will be seen that I have provided apparatus well suited for carrying out the series of steps of the method as outlined above, and that I have provided not only a new method of stabilizing the frequency of an electrically-controlled oscillator, but that I have provided also new apparatus for carrying out this method, and that both are well adapted to attain the ends and objects hereinbefore set forth. It will be apparent that many different types of apparatus may be used to carry out the invention, each apparatus being modified in accordance with the economic and performance requirements of each particular use.

I claim:

1. A stabilized signal-generating system comprising an oscillator, frequency-determining means forming part of said oscillator and including a controllable inductor, means for producing a direct-current compensating signal whose amplitude is a function of the amplitude of the signals produced by said oscillator, discriminator means coupled to said oscillator, detector means coupled to said discriminator and arranged to produce a direct-current measuring signal whose amplitude is a function of the amplitude and frequency of the signals delivered by the oscillator, means for combining said compensating and measuring signals in opposition to produce a resultant control signal, and means for applying said control signal to said controllable inductor.

2. A stabilized signal-generating system comprising an oscillator, means for combining said compensating and said oscillator and including a controllable inductor, means for producing a direct-current compensating signal whose amplitude is a function of the amplitude of the signals produced by said oscillator, discriminator means coupled to said oscillator, detector means coupled to said discriminator and arranged to produce a direct current measuring signal whose amplitude is a function of the amplitude and frequency of the signals delivered by the oscillator, manual means for varying the relative amplitudes of said compensating and measuring signals, means for combining said compensating and measuring signals in opposition to produce a resultant control signal, and means for applying said control signal to said controllable inductor.

3. A stabilized signal-generating system comprising an oscillator, frequency-determining means forming part of said oscillator and including a controllable inductor having control and signal windings, means for producing a direct-current compensating signal whose amplitude is a function of the amplitude and independent of the frequency of the signals produced by said oscillator, discriminator means coupled to said oscillator, detector means coupled to said discriminator and arranged to produce a direct-current measuring signal whose amplitude is a function of both the amplitude and frequency of the signals delivered by the oscillator, means for combining said compensating and measuring signals in opposition to produce a resultant control signal, means for amplifying said control signal, and means coupling said amplified control signal to said control winding of the controllable inductor.

4. A stabilized signal-generating system comprising an oscillator, frequency-determining means forming part of said oscillator and including a controllable inductor, a first rectifier and filter circuit coupled to said oscillator for producing a direct-current compensating signal whose amplitude is a direct function of the amplitude and independent of the frequency of the signals produced by said oscillator, a discriminator circuit coupled to said oscillator, a second rectifier and filter circuit coupled to said discriminator and arranged to produce a direct-current measuring signal whose amplitude is a function of the amplitude and frequency of the signals delivered by the oscillator, circuit means for combining said compensating and measuring signals in opposition to produce a resultant control signal, an amplifier having an input terminal coupled to said circuit means, adjustable means arranged to control the relative proportions of said measuring and compensating signals effective at said input terminal, and means connecting the output of said amplifier to said controllable inductor.

5. A stabilized signal-generating system comprising an oscillator, frequency-determining means forming part of said oscillator and including a controllable inductor having a magnetizable core, means for producing a direct-current compensating signal whose amplitude is a function of the amplitude of the signals produced by said oscillator, discriminator means coupled to said oscillator, detector means coupled to said discriminator and arranged to produce a direct-current measuring signal whose amplitude is a function of the amplitude and frequency of the signals delivered by the oscillator, means coupling said compensating and measuring signals to said controllable inductor, and means for producing in said core a flux density that is a function of the difference in amplitude of said measuring and compensating signals.

6. A stabilized signal-generating system including an oscillator having a frequency-controlling network, means for producing a direct-current compensating signal whose amplitude is a function of the amplitude and independent of the frequency of the signals produced by said oscillator, discriminator means coupled to said oscillator, detector means coupled to said discriminator and arranged to produce a direct-current measuring signal whose amplitude is a function of the amplitude and frequency of the signals delivered by the oscillator, means for combining said compensating and measuring signals in opposition to produce a resultant control signal, and means for applying said control signal to said frequency-controlling network.

References Cited in the file of this patent

UNITED STATES PATENTS

| | | |
|---|---|---|
| 1,987,730 | Cravath | Jan. 15, 1935 |
| 2,383,847 | Crosby | Aug. 28, 1945 |
| 2,623,177 | Hugenholtz | Dec. 23, 1952 |

UNITED STATES PATENT OFFICE

CERTIFICATE OF CORRECTION

Patent No. 2,811,642

October 29, 1957

William D. Gabor

It is hereby certified that error appears in the printed specification of the above numbered patent requiring correction and that the said Letters Patent should read as corrected below.

Column 2, line 42, for "used" read -- equal --; column 3, line 66, after "frequency and" insert -- amplitude --; column 6, line 14, strike out "means for combining said compensating and" and insert instead -- frequency-determining means forming part of --.

Signed and sealed this 4th day of February 1958.

(SEAL)
Attest:

KARL H. AXLINE

Attesting Officer

ROBERT C. WATSON
Commissioner of Patents